(12) United States Patent
Khoury et al.

(10) Patent No.: US 6,250,933 B1
(45) Date of Patent: Jun. 26, 2001

(54) CONTACT STRUCTURE AND PRODUCTION METHOD THEREOF

(75) Inventors: Theodore A. Khoury; James W. Frame, both of Chicago, IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/488,661

(22) Filed: Jan. 20, 2000

(51) Int. Cl.[7] .............................. H01R 12/00; H05K 1/00
(52) U.S. Cl. ............................................ 439/66; 324/754
(58) Field of Search ........................ 439/66, 81; 324/754, 324/757, 762

(56) References Cited

U.S. PATENT DOCUMENTS

| | | | |
|---|---|---|---|
| 4,636,722 | * | 1/1987 | Ardezzone ............................ 324/158 |
| 5,563,521 | * | 10/1996 | Crumly ................................. 324/757 |
| 5,852,871 | | 12/1998 | Khandros . |
| 5,864,946 | | 2/1999 | Eldridge et al. . |
| 5,938,452 | * | 8/1999 | Wojnarowski ........................ 439/67 |
| 6,181,145 | * | 1/2001 | Tomita et al. ........................ 324/754 |

FOREIGN PATENT DOCUMENTS

2680284 * 9/1991 (FR) .

OTHER PUBLICATIONS

"Micro IC Probe for LSI Testing" Takahiro Ito et al., 12th Annual IEEE International MEMS '99 Conference, 1999.

* cited by examiner

Primary Examiner—Brian Sircus
Assistant Examiner—Michael C. Zarroli
(74) Attorney, Agent, or Firm—Muramatsu & Associates

(57) ABSTRACT

A contact structure for achieving an electrical connection with a contact target is formed of a contact substrate and a plurality of contactors mounted on the contact substrate. The contactors are produced on a semiconductor substrate or other dielectric by a microfabrication technology. Each of the contactors has a contact bump to contact with the contact target. In one aspect, one of the base portions of the contactor is slidably formed on the surface of the contact substrate. A spring force is generated when the contactor is pressed against the contact target. Various types of contact structures and the associated production methods are also described.

17 Claims, 16 Drawing Sheets

Fig. 3
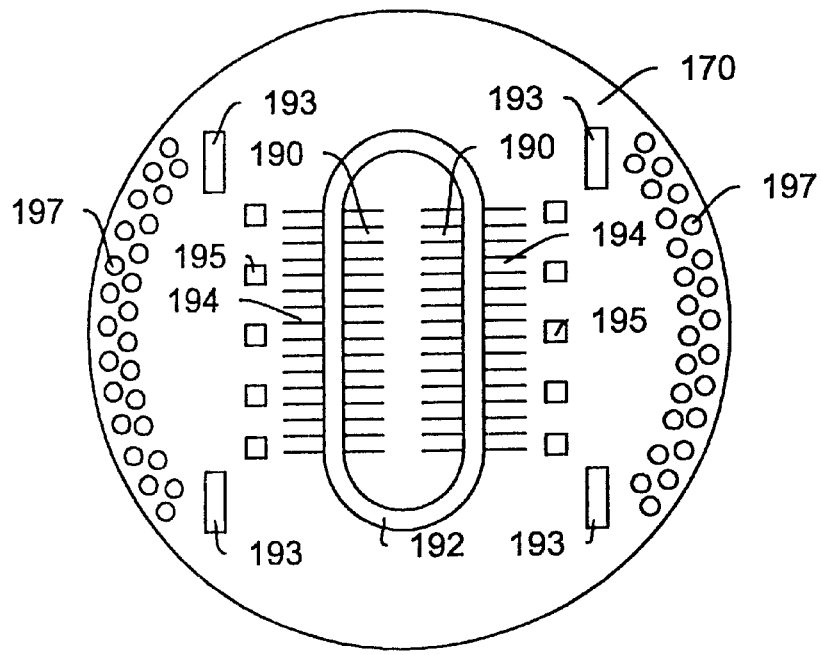
Fig. 4A
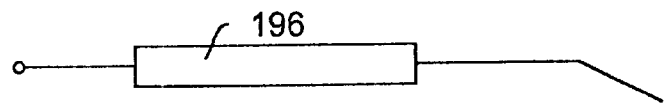
Fig. 4B
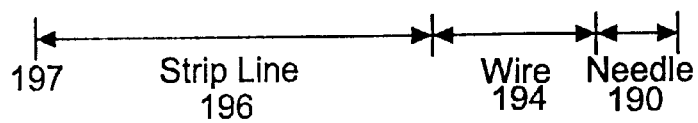
Fig. 4C
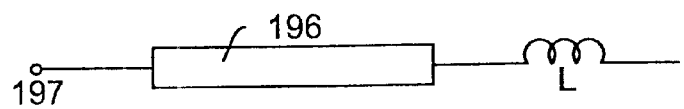
Fig. 4D
Fig. 4E
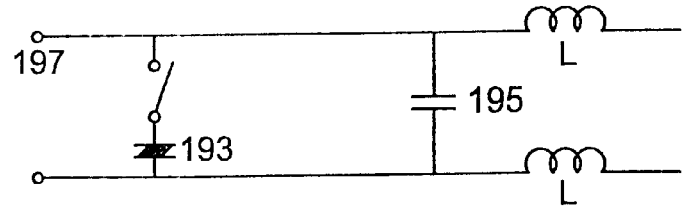

CONTACT STRUCTURE AND PRODUCTION METHOD THEREOF

FIELD OF THE INVENTION

This invention relates to contact structures to establish electrical connection with contact targets such as contact pads or leads of electronic circuits or devices, and more particularly, to contact structures to be used in a probe card to test semiconductor wafers, semiconductor chips, packaged semiconductor devices, module sockets, printed circuit boards and the like with an improved frequency bandwidth, pin pitch and contact performance and reliability.

BACKGROUND OF THE INVENTION

In testing high density and high speed electrical devices such as LSI and VLSI circuits, high performance contact structures, such as probe contactors or test contactors, must be used. The contact structure of the present invention is not limited to the application of testing and burn-in of semiconductor wafers and dice, but is inclusive of testing and burn-in of packaged semiconductor devices, printed circuit boards and the like. The contact structure of the present invention can also be used in more generic applications including an IC lead, IC packaging, and other electrical connections. However, for the convenience of explanation, the present invention is described mainly with reference to the semiconductor wafer testing.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables 110. The test head 100 and a substrate handler 400 are mechanically as well as electrically connected with one another with the aid of a manipulator 500 which is driven by a motor 510. The semiconductor wafers to be tested are automatically provided to a test position of the test head 100 by the substrate handler 400.

On the test head 100, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals are compared with expected data to determine whether the IC circuits on the semiconductor wafer function correctly.

In FIG. 1, the test head 100 and the substrate handler 400 are connected through an interface component 140 consisting of a performance board 120 (shown in FIG. 2) which is a printed circuit board having electric circuit connections unique to a test head's electrical footprint, coaxial cables, pogo-pins and connectors. In FIG. 2, the test head 100 includes a large number of printed circuit boards 150 which correspond to the number of test channels (test pins) of the semiconductor test system. Each of the printed circuit boards 150 has a connector 160 to receive a corresponding contact terminal 121 of the performance board 120. A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

As shown in FIG. 2, the test head 100 is placed over the substrate handler 400 and mechanically and electrically connected to the substrate handler through the interface component 140. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or contact pads in the IC circuit on the semiconductor wafer 300 under test.

Electrical terminals or contact receptacles (contact pads) of the probe card 170 are electrically connected to the contact pins 141 provided on the frog ring 130. The contact pins 141 are also connected to the contact terminals 121 of the performance board 120 through the coaxial cables 124 where each contact terminal 121 is connected to the printed circuit board 150 of the test head 100. Further, the printed circuit boards 150 are connected to the semiconductor test system through the cable 110 having, for example, several hundreds of inner cables.

Under this arrangement, the probe contactors 190 contact the surface (contact targets) of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the IC circuits on the semiconductor wafer 300 performs properly.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 moves upward in FIG. 2, the tips of the cantilevers 190 contact the pads or bumps (contact targets) on the wafer 300. The ends of the cantilevers 190 are connected to wires 194 which are further connected to transmission lines (not shown) formed in the probe card 170. The transmission lines are connected to a plurality of electrodes (contact pads) 197 which are in communication with the pogo pins 141 of FIG. 2.

Typically, the probe card 170 is structured by a multilayer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant and magnetic permeability of the polyimide, inductances and capacitances of the signal paths within the probe card 170. Thus, the signal lines are impedance matched lines establishing a high frequency transmission bandwidth to the wafer 300 for supplying currents in a steady state as well as high current peaks generated by the device's outputs switching in a transient state. For removing noise, capacitors 193 and 195 are provided on the probe card between the power and ground planes.

An equivalent circuit of the probe card 170 is shown in FIG. 4 to explain the limitation of the high frequency performance in the conventional probe card technology. As shown in FIGS. 4A and 4B, the signal transmission line on the probe card 170 extends from the electrode 197, a strip (impedance matched) line 196, a wire 194 and the needle or cantilever (contact structure) 190. Since the wire 194 and needle 190 are not impedance matched, these portions function as an inductor L in the high frequency band as shown in FIG. 4C. Because of the overall length of the wire 194 and needle 190 is around 20–30 mm, significant limitations will be resulted from the inductor when testing a high frequency performance of a device under test.

Other factors which limit the frequency bandwidth in the probe card 170 reside in the power and ground needles shown in FIGS. 4D and 4E. If the power line can provide large enough currents to the device under test, it will not seriously limit the operational bandwidth in testing the device. However, because the series connected wire 194 and needle 190 for supplying the power (FIG. 4D) as well as the series connected wire 194 and needle 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT. These capacitors serve the function as high frequency decoupling on the power lines. In other words, the capacitors limit the high frequency performance of the probe contactor.

Accordingly, the most widely used probe contactors as noted above are limited to the frequency bandwidth of approximately 200 MHz which is insufficient to test recent semiconductor devices. In the industry, it is considered that the frequency bandwidth comparable to the tester's capability, which is currently on the order of 1 GHz or higher, will be necessary in the near future. Further, it is desired in the industry that a probe card is capable of handling a large number of semiconductor devices, especially memories, such as 32 or more, in a parallel fashion to increase test throughput.

In the conventional technology, the probe card and probe contactors such as shown in FIG. 3 are manually made, resulting in inconsistent quality. Such inconsistent quality includes fluctuations of size, frequency bandwidth, contact forces and resistance, etc. In the conventional probe contactors, another factor making the contact performance unreliable is a temperature change under which the probe contactors and the semiconductor wafer under test have different temperature expansion ratios. Thus, under the varying temperature, the contact positions therebetween vary which adversely affects the contact force, contact resistance and bandwidth. Thus, there is a need of a contact structure with a new concept which can satisfy the requirement in the next generation semiconductor test technology.

SUMMARY OF THE INVENTION

Therefore, it is an object of the present invention to provide a contact structure for electrically contacting with a contact target which is capable of achieving a high frequency bandwidth, high pin counts and high contact performance as well as high reliability.

It is another object of the present invention to provide a contact structure such as a probe contactor to establish electrical connection, in applications such as testing semiconductor devices and the like, with a very high frequency bandwidth to meet the test requirements in the next generation semiconductor technology.

It is a further object of the present invention to provide a contact structure to establish electrical connection, in applications such as testing semiconductor devices, which are suitable for testing a large number of semiconductor devices in parallel at the same time.

It is a further object of the present invention to provide a contact structure to establish electrical connection in testing semiconductor devices, which are produced through a semiconductor production process without involving manual assembly or handling, thereby achieving consistent quality.

It is a further object of the present invention to provide a contact structure to be mounted on a probe card for testing semiconductor devices which are capable of compensating temperature expansion coefficient of a semiconductor wafer under test.

In the first aspect of the present invention, the contact structure is comprised of a substrate such as a silicon substrate and contactors formed on the substrate through a microfabrication process in which each contactor has a bridge shape two ends of which are vertically connected to the substrate and a horizontal portion of which is provided with a contact portion, wherein the contact portion has a conductive bump and the horizontal portion of the contactor produces a contact force when the contactor is pressed against the contact target.

Another aspect of the present invention is a contact structure having a contact substrate on which a plurality of bridge shaped contactors are mounted. The contact structure includes a contact substrate and a plurality of contactors formed on the substrate through a microfabrication process. The contactor has a bridge like shape or an inverse U-shape formed with a horizontal portion and two vertical portions for supporting the horizontal portion and a contact bump with hard conductive material attached to the horizontal portion. The horizontal portion and the vertical portions of the contactor produce a contact force when the contactor is pressed against the contact target. The shape of the contact bump can be spherical, trapezoidal, squarish, conical, or pyramidal.

A further aspect of the present invention is a contact structure having a recess or depression on the substrate to be used for a contact target with a relatively large protrusion such as a solder ball or solder bump. The contact structure includes a dielectric substrate having a recess (groove, depression) on a surface thereof and a contactor formed on the substrate through a microfabrication process. The contactor is comprised of a horizontal portion having two vertical ends connected to the dielectric substrate where the horizontal portion is positioned over the recess on the dielectric substrate. The horizontal portion of the contactor produces a contact force when the contactor is pressed against the contact target such that a middle portion of the horizonal portion may enter the recess to exert a contact force.

A further aspect of the present invention is a contact structure having a recess on the substrate to be used for a contact target with relatively large protrusion such as a solder ball or solder bump. The contact structure includes a dielectric substrate having a depression (recess) on a surface thereof and a contactor formed on the substrate through a microfabrication process. The contactor is comprised of a horizontal portion having a fixed end which is bent vertically and connected to the dielectric substrate and a free end wherein a middle part of the horizontal portion functions as a contact portion. The fixed end is connected to the substrate and the free end is positioned over the recess on the substrate. The horizontal portion of the contactor produces a contact force when the contactor is pressed against the contact target such that the free end of the horizonal portion goes in the recess to exert a contact force.

According to the present invention, the contact structure has a very high frequency bandwidth to meet the test requirements of next generation semiconductor technology. Since the contact structure is formed through a modern miniaturization technology developed and used in the semiconductor production industry, a large number of contactors can be aligned in a small space which is suitable for testing a large number of semiconductor devices at the same time. The contact structure of the present invention can also be used in more general applications including an IC lead, IC packaging, module sockets and other electrical connections.

Since the large number of contactors are produced at the same time on the substrate with the use of the microfabrication technology without involving manual handling, it is possible to achieve consistent quality, high reliability and long life in the contact performance. Further, because the contactors can be fabricated on the same substrate material as that of the device under test, it is possible to compensate the temperature expansion coefficient of the device under test, which is able to avoid positional errors.

BRIEF DESCRIPTION OF THE DRAWINGS

FIG. 3 is a bottom view showing an example of the probe card having an epoxy ring for mounting a plurality of probe contactors (needles or cantilevers) in the conventional technology.

FIGS. 4A–4E are circuit diagrams showing equivalent circuits of the probe card of FIG. 3.

DETAILED DESCRIPTION OF THE PREFERRED EMBODIMENT

Figure 5:
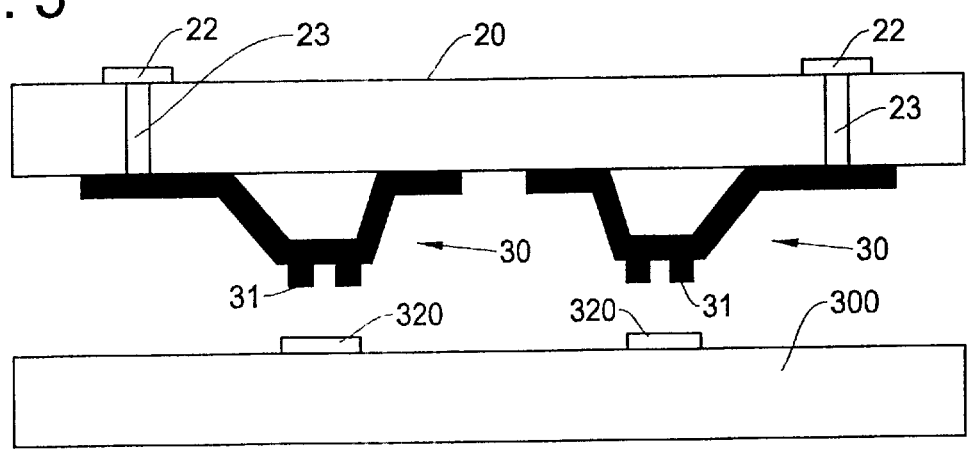
FIG. 5 is a schematic cross sectional diagram showing a first embodiment of the contact structure in the present invention having square shaped contact bumps.
Figure 6:
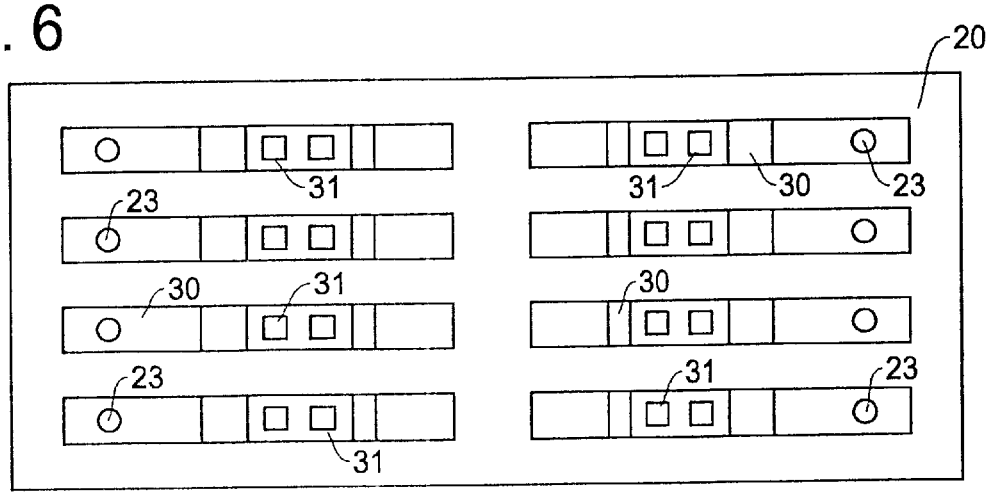
FIG. 6 is a schematic diagram showing a bottom view of the contact structure in the present invention corresponding to FIG. 5.
Figure 7:
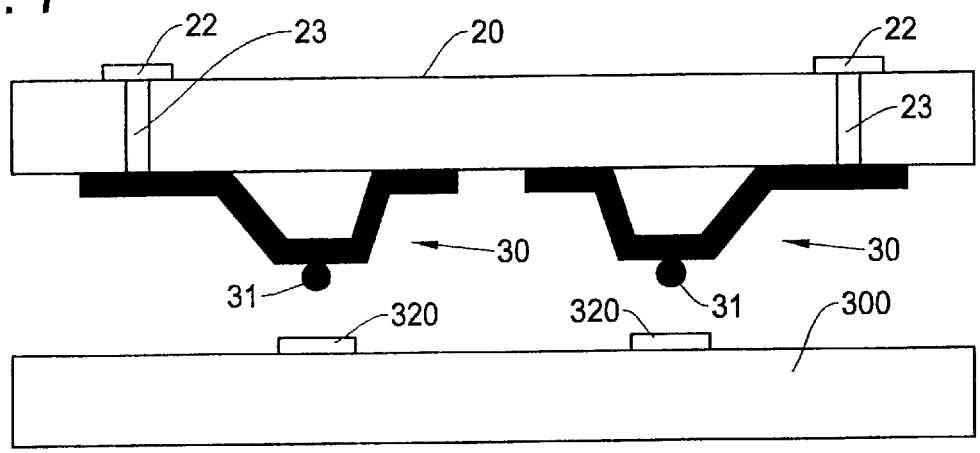
FIG. 7 is a schematic cross sectional diagram showing another example of the first embodiment of the contact structure having sphere shaped contact bumps.
Figure 8:
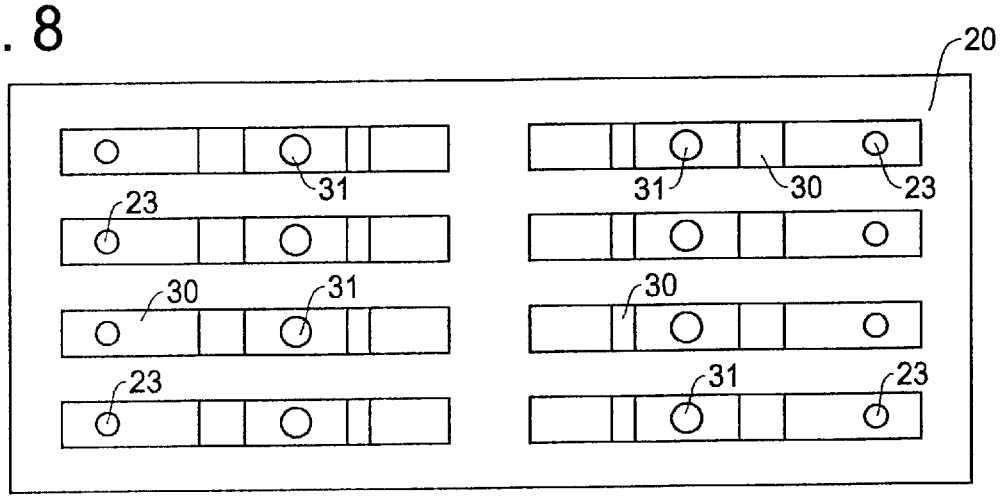
FIG. 8 is a schematic diagram showing a bottom view of the contact structure in the present invention corresponding to FIG. 7.

The first embodiment of the contact structure is shown in FIGS. 5–14. FIGS. 5 and 6 show one of the examples of the first embodiment of the present invention wherein FIG. 5 is a schematic cross sectional diagram and FIG. 6 is a bottom view of the contact structure of FIG. 5. FIGS. 7 and 8 show another example of the first embodiment of the present invention wherein FIG. 7 is a schematic cross sectional diagram and FIG. 8 is a bottom view of the contact structure of FIG. 7.

In the example of FIGS. 5 and 6, the contact structure has a plurality of contactors 30 formed on a contact substrate 20. The contact structure is positioned over a semiconductor wafer 300 having contact targets 320 such as contact pads or electrodes. Typically, the contact substrate 20 is made of silicon. Other materials such as glass fiber, ceramic, alumina or other dielectric materials are also feasible for the contact substrate. All of the contactors 30 are produced through the same production processes on the silicon substrate 20 or a separate substrate. Such a semiconductor production process includes a photolithography process, a micro-machining process such as using an electron beam, laser beam or plasma beam micromachining tool, a plastic molding process (hot embossing), and the like.

In FIGS. 5 and 6, the contactor 30 has a bridge like shape on which one ore more contact bumps 31 are provided as contact points. The shape of the contact bump can be spherical, trapezoidal, squarish, conical, or pyramidal. The example of FIGS. 5 and 6 shows the contact bump having a squarish shape while the example of FIGS. 7 and 8 shows the contact bump having a spherical shape. The contactor 30 includes a horizontal portion, two vertical (or angled) portions supporting the horizontal portion, and base portion fixed to the contact substrate 20. The base portion of the contactor 30 functions as an interconnect trace to be connected to a contact pad or electrode 22 on the upper surface of the contact substrate 20. Thus, the contactor 30 is in electrical communication with the electrode 22 on the contact substrate 20 through a via hole 23. The electrode 22 is to interconnect the contact substrate 20 to an external structure such as a probe card or IC package through a wire or lead.

Thus, when the semiconductor wafer 300 moves upward in FIG. 5 or 7, the contactors 30 (contact bumps 31) and the contact targets (pads) 320 on the wafer 300 mechanically and electrically contact with one another. Consequently, signal paths are established from the contact targets 320 to the electrodes 22 on the contact substrate 20. The base portion of the contactor, the via hole 23 and the electrode 22 also function to fan-out (enlarge) the small pitch of the contactors 30 to a larger pitch to fit to an external circuitry such as a probe card or IC package.

Preferably, the bridge like contactor 30 has an asymmetrical shape in cross section as shown FIGS. 5 and 7 for better contact performance. Namely, the two vertical (or angled) portions are angled differently from one another relative to the horizontal portion or the horizontal surface of the contact substrate 20. Because of the bridge like (trapezoid) shape of the contactor 30, it produces a sufficient contact force when the contactor 30 is pressed against the substrate 320 by the upward movement of the wafer 300. Further, because of the asymmetrical shape of the bridge portion, when pressed against the contact target 320, the contactor 30 also moves in a transversal direction (perpendicular to the movement of the wafer 300).

This transversal movement improves the contact performance in the contact structure of the present invention. The contact bump 31 on the bridge shape contactor 30 is made of hard conductive material. The contact bumps 31 move in the horizontal direction of FIGS. 5 and 7 as noted above when pressed against the contact pad 320. Therefore, a scrubbing effect will be achieved in which the square contacts 31 scrub a metal-oxide layer on the surface of the contact pad 320. For example, if the contact target 320 on the wafer 300 has an aluminum oxide layer on its surface, the scrubbing effect promotes sufficient electric contact with low contact resistance.

As noted above, the spring force (elasticity) derived from the bridge like (trapezoid) shape of the contactor 30 provides an appropriate contact force against the contact target 320. The elasticity produced by the spring force of the contact structure also functions to compensate the differences in size or the fluctuation of flatness involved in the substrate 20, the contact target 320 and the wafer 300, as well as the contactors 30.

Although only two contactors 30 are shown in FIGS. 5 and 7, a large number of contactors 30 will be aligned on the substrate 20 in an actual implementation of the semiconductor wafer testing. The pitch between the contact pads 320 may be as small as 50 $\mu$m or less. The contactors 30 of the present invention can easily be aligned in the same pitch since the contactors are made by the same semiconductor production process as the wafer 300 are made.

The contactors 30 on the contact substrate 20 can be directly mounted on a probe card such as shown in FIG. 3, or molded in a package, such as a traditional IC package having leads, so that the package is mounted on a probe card. Since the contactors 30 can be produced in a very small size, such as several ten to several hundred micrometers, a frequency bandwidth of a probe card mounting the contactors of the present invention can be easily increased to 2 GHz or higher. Because of the small size, the number of contactors on a probe card can be increased to, for example 2,000, which is able to test as many as 32 or more memory devices in parallel at the same time.

Furthermore, because the contactors 30 of the present invention are formed on the contact substrate 20, which is typically a silicon substrate, physical changes of the silicon substrate cause by environmental changes such as a temperature expansion ratio are the same as those of the semiconductor wafer 300 under test. Therefore, the accurate positioning between the contactors 30 and the pads 320 can be maintained throughout the test.

An example of material of the contactor 30 includes nickel, aluminum, copper, nickel palladium, rhodium, nickel gold, iridium or several other depositable materials. An example of the contact bump 31 is a glass ball coated with tungsten or other metal. Another example of the contact bump 31 is a ball shaped, square shaped, or pyramid shaped bump made of a hard metal such as nickel, beryllium, aluminum, copper, nickel-cobalt-iron alloy, or iron-nickel alloy.

Further, the contact bump 31 can be formed of base metals such as nickel, beryllium, aluminum, copper or various alloys as noted above and plated with a highly conductive, non-oxidizing metals such as gold, silver, nickel palladium, rhodium, nickel gold, or iridium. The contact bump 31 is attached to the top of the contactor 30 by soldering, brazing, welding, or applying a conductive adhesive. The shape of the contact bump 31 can also be hemispherical so that a non-spherical portion is connected to the top of the contactor 30. As noted above, other shapes in the contact bump 31 are possible which include trapezoidal, squarish, conical, or pyramidal shapes.

An example of size of the contactor 30 intended for a probe-test application may be 100–400 $\mu$m in overall height, 100–800 $\mu$m in horizontal length for the pitch of 50 $\mu$m between contact targets. An example of diameter or width and height of the contact bump 31 is about 40 $\mu$m. However, a wider range of sizes can be possible within the concept of the present invention.

Figure 9A:
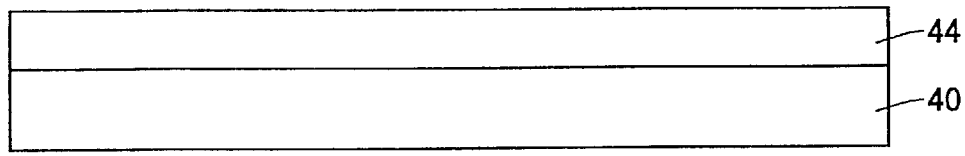
FIGS. 9A–9I are schematic diagrams showing an example of process for producing the first embodiment of the contact structure corresponding to FIGS. 5 and 7.
Figure 9B:
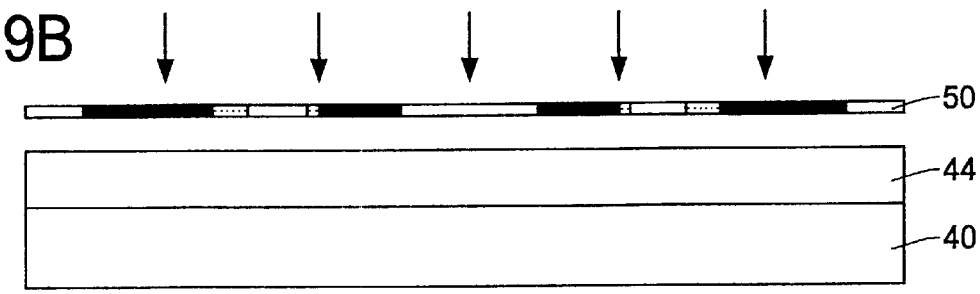

FIGS. 9A–9I show an example of process for producing the contactor 30 of the present invention through the photolithography technology, although many other production processes can also be feasible. In FIG. 9A, a photoresist layer 44 is provided on a silicon substrate 40. In FIG. 9B, a photomask 50 is positioned over the photoresist layer 44 so that the photoresist layer 44 is exposed with UV (ultraviolet) light through a pattern of contactors printed on the photomask 50.

In this example, the photomask 50 is a gray-tone mask which includes not only transparent and opaque portions but intermediate (semi-transparent or gray) portions as well. The photoresist which is not exposed with the UV light because of the opaque (black) portion of the photomask 50 is uncured. The photoresist which is exposed with the UV light because of the transparent (white) portion of the photomask 50 is cured. In the semi-transparent portions of the photomask 50, the tone is changed linearly from the opaque (black) to transparent (white). Thus, the photoresist 44 which is exposed with the UV light of varying intensity because of the semi-transparent (gray) portion of the photomask 50 is cured in an asymptotic manner.

Figure 9C:
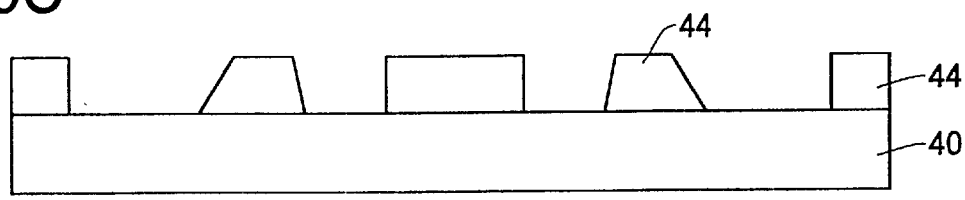
Figure 9D:
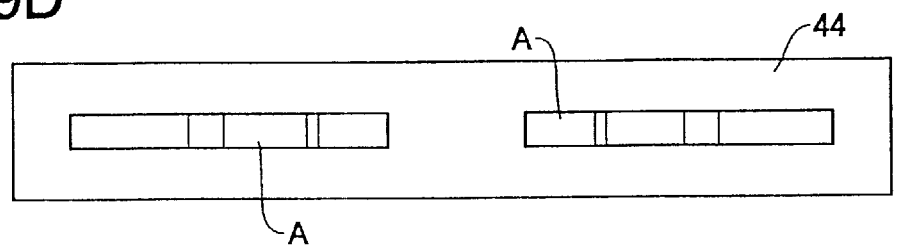
Figure 9E:
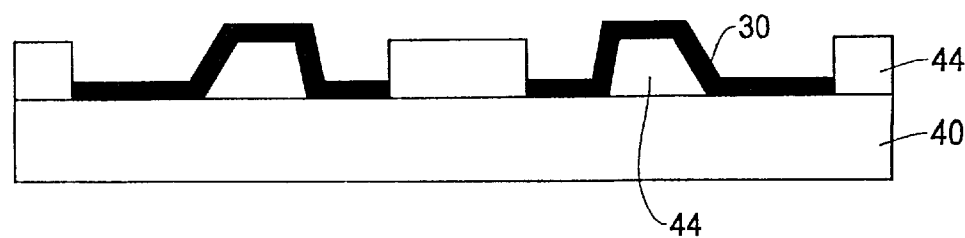

Thus, when the uncured photoresist is removed, the cured photoresist layer 44 remains which shows a pattern as shown in FIG. 9C in which the photoresist corresponding to the gray-tone has inclined edges. FIG. 9D shows a top view of the pattern produced on the cured photoresist layer 44. On the pattern of FIG. 9D, a plating seed layer (not shown) is provided on which an electroplating process is applied to create contactors 30 of a bridge shape as shown in FIG. 9E. An example of material in the contactor 30 includes nickel, aluminum and copper. Alternatively, a variety of deposition techniques can be used in producing the contactor 30 including vacuum evaporation, cathode sputtering, vapor-phase deposition.

Figure 9F:
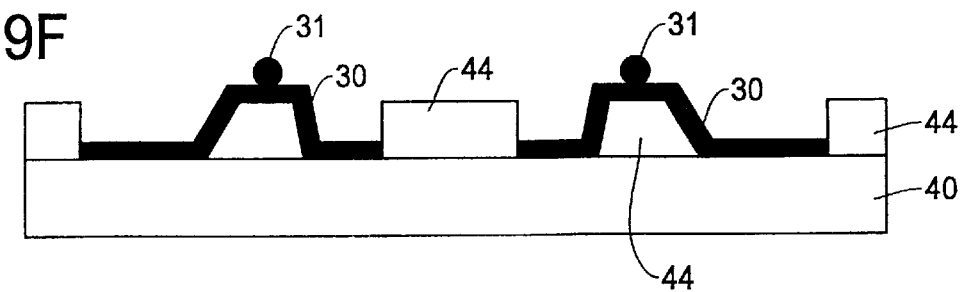
Figure 9G:
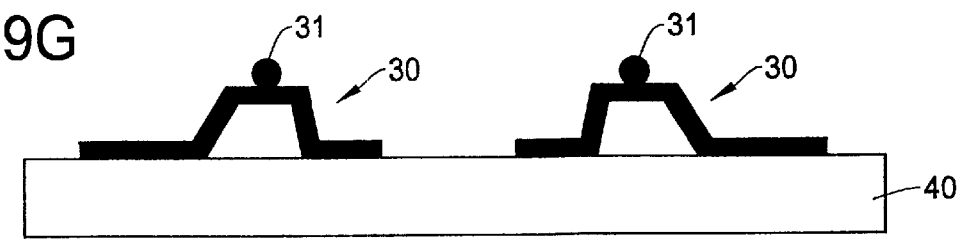
Figure 9H:
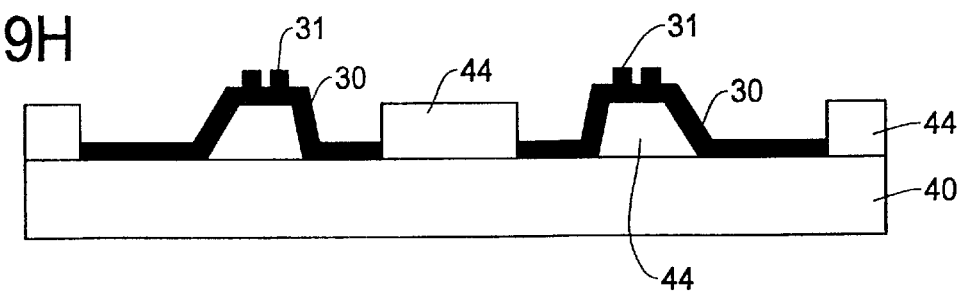
Figure 9I:
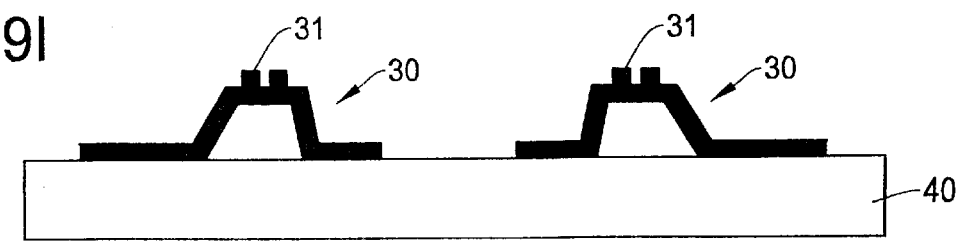

In FIG. 9F, the sphere shaped contact bump 31 is attached to the top of the contactor 30 to form the contact structure of FIG. 7. As noted above, an example of the contact bump 31 is a glass ball coated with tungsten or other metal. Another example of the sphere contact bump 31 is a ball shaped metal contact made of hard metal such as nickel, beryllium, aluminum or copper. The sphere contact bump 31 is attached to the top of the contactor 30 by soldering, brazing, welding, or applying a conductive adhesive. The photoresist 44 is removed in FIG. 9G. Thus, the bridge shaped contactor 30 is produced in the production process described in the foregoing. FIGS. 9H and 9I correspond to the process of FIGS. 9F and 9G and show the square shaped contact bumps 31 to form the contact structure of FIG. 5.

Figure 10A:
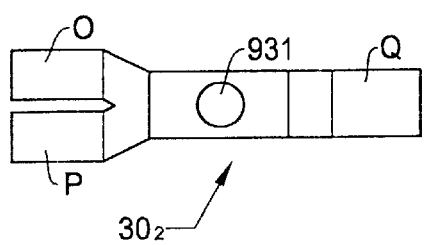
FIGS. 10A–10C are schematic diagrams showing a further example of contact structure in the first embodiment having a modified structure in the base portion thereof.
Figure 10B:
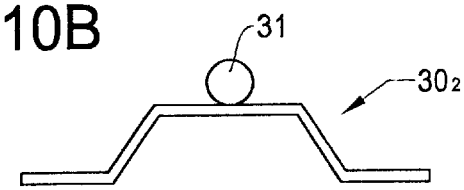
Figure 10C:
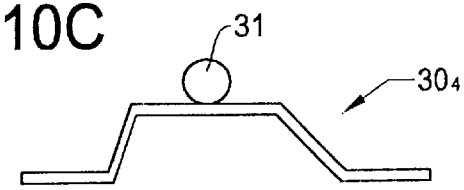

FIGS. 10A–10C show a further modification of the contactor in the first embodiment of the present invention. FIG. 10A is a top view of a contactor $30_2$ and FIGS. 10B and 10C are cross sectional front views of the contactor $30_2$ of FIG. 10A. The bridge of the contactor $30_2$ of FIG. 10B has an asymmetrical shape in which two vertical (or angled) portions have differences in angle and length from one another. In contrast, the bridge shaped contactor $30_2$ in FIG. 10B has a symmetrical shape. The asymmetrically shaped bridge of FIG. 10C is preferable when the transversal movement of the contact bump is desired to achieve a higher degree of the scrubbing effect. The symmetrically shaped bridge of FIG. 10B is preferable when a higher contact force is desired. One of vertical portions of the contactor $30_2$ of FIGS. 10A–10C is widened toward the bottom and is connected to two base portions O and P at one side for improving a mechanical strength as well as achieving a fan-out for increasing a pin pitch as well as a number of pins.

Figure 11A:
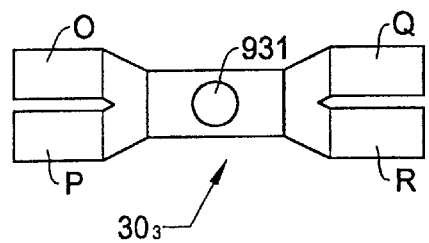
FIGS. 11A–11C are schematic diagrams showing a further example of contact structure in the first embodiment having another modified structure in the base portion thereof.
Figure 11B:
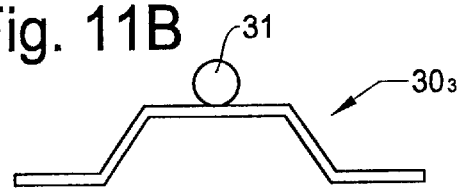
Figure 11C:
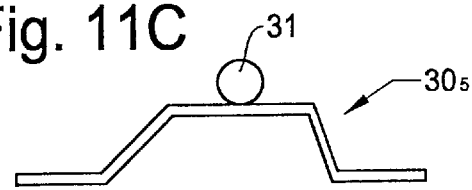

FIGS. 11A–11C show a further modification of the contactor in the first embodiment of the present invention. FIG. 11A is a top view of a contactor $30_3$ and FIGS. 11B and 11C are cross sectional front views of the contactor $30_3$ of FIG. 11A. The bridge of the contactor $30_3$ of FIG. 11C has an asymmetrical shape in which two vertical (or angled) portions have differences in angle and length from one another. In contrast, the bridge shaped contactor $30_3$ in FIG. 11B has a symmetrical shape. The asymmetrically shaped bridge of FIG. 11C is preferable when the transversal movement of the contact bump is desired to achieve a higher degree of the scrubbing effect. The symmetrically shaped bridge of FIG. 11B is preferable when a higher contact force is desired. Both vertical portions of the contactor $30_3$ of FIGS. 11A–11C are widened toward the bottom thereof and connected to two base portions O and P at one side and two base portions Q and R at the other side for improving a mechanical strength of the contactor as well as achieving a fan-out for increasing a pin pitch as well as a number of pins.

Figure 12A:
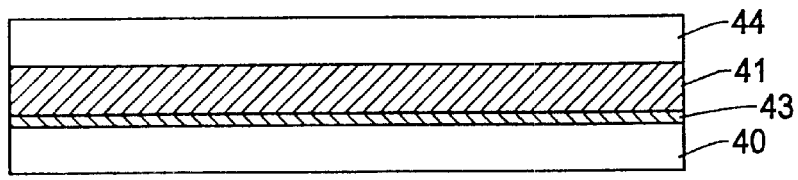
FIGS. 12A–12I are schematic diagrams showing another example of production process using a silicon-on-insulator (SOI) technology for forming the contact structure in the first embodiment of the present invention.

FIGS. 12A–12I show an example of process for producing the contactor in the first embodiment of the present invention. In this example, the production process involves a silicon-on-insulator (SOI) method in which a silicon layer is mounted on an insulation layer of another silicon layer (substrate). In the process of FIG. 12A, a silicon substrate 40 and a silicon layer 41 are juxtaposed with one another having an insulation layer 43 therebetween. Typically, the insulation layer 43 is a silicon dioxide layer developed on the surface of either one or both of the silicon substrates 40 and 41. Also in FIG. 12A, the production process deposits photoresist to form a photoresist layer 44 on the silicon substrate 41.

Figure 12B:
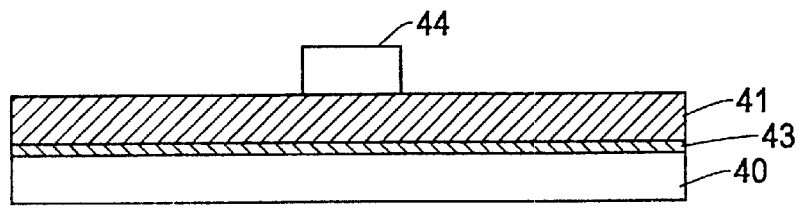
Figure 12C:
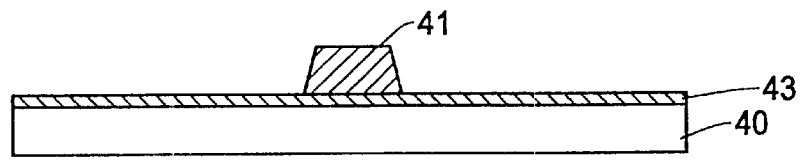

In FIG. 12B, with use of a photomask and UV lights (not shown) such as a process shown in FIG. 9B, the photoresist layer 44 is defined to form a bridge shape on the substrate 40. Then the top silicon layer 41 is etched either through an isotropic or anisotropic etching process depending on the desired shape. Thus, as shown in FIG. 12C, the top silicon layer 41 defining the bridge shaped contactors remains on the silicon substrate 40. On the upper surface of the silicon substrate 40 and the silicon layer 41 of FIG. 12C, an electroplating seed layer (not shown) is formed by depositing conductive material thereon.

Figure 12D:
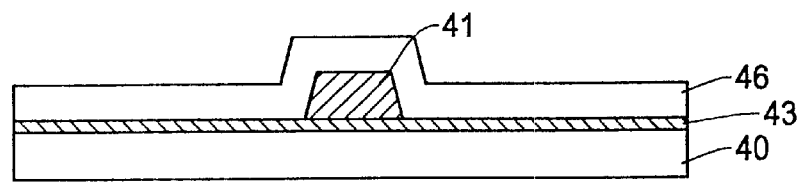
Figure 12E:
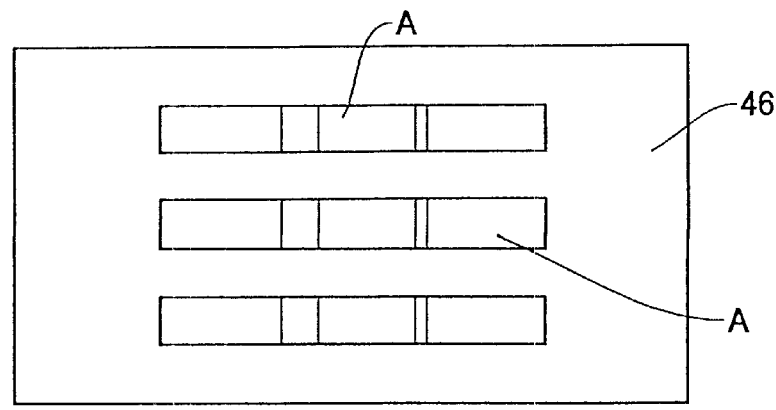

In the process of FIG. 12D, a photoresist layer 46 is provided on the seed layer. Through a photo exposure and development process, when the uncured photoresist is removed, the cured photoresist layer 46 remains on the substrate 40 which shows a pattern A corresponding to the bridge shaped contactors of the present invention. FIG. 12E shows a top view of the pattern of the contactors produced on the cured photoresist layer 46.

Figure 12F:
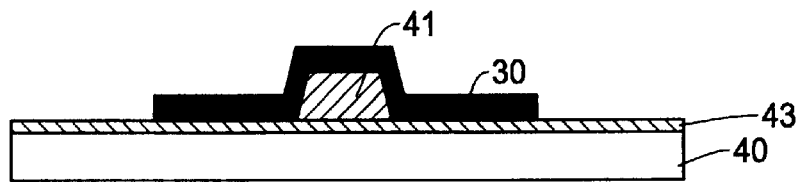
Figure 12G:
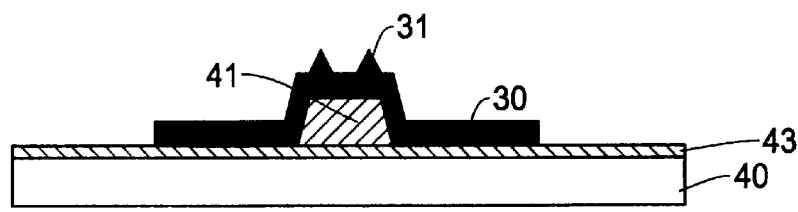
Figure 12H:
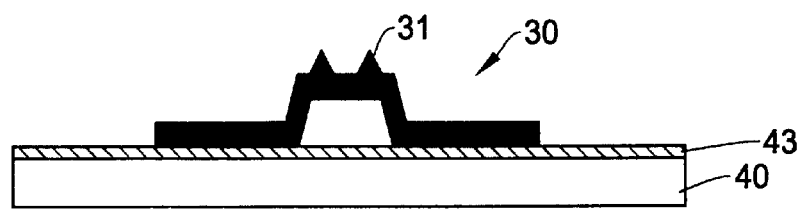
Figure 12I:
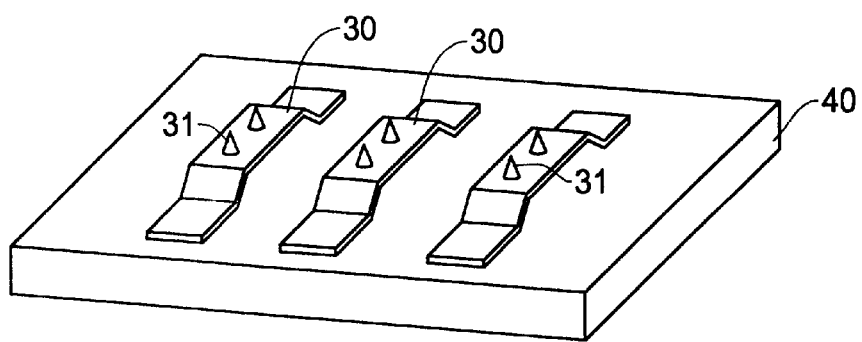

In FIG. 12F, contactors 30 are formed through an electroplating process on the silicon substrate 40 and top silicon layer 41. An example of material in the contactor 30 includes nickel, aluminum and copper. Alternatively, a variety of deposition techniques can be used in producing the contactor 30 including vacuum evaporation, cathode sputtering, vapor-phase deposition. Then, the process forms the contact bumps 31 on the top portion of the contactor 30 as shown in FIG. 12G. The contact bumps 31 can be attached to the contactors 30 by soldering, brazing, welding, or applying a conductive adhesive. Alternatively, the contact bumps 31 may be created through a photolithography process by depositing the photoresist on the contactors 30, defining the contact bumps on the photoresist, and electroplating the conductive material on the contactors 30. By etching the top silicon layer 41, the contactors 30 having contact bumps 31 are created as shown in FIGS. 12H and 12I.

Figure 13A:
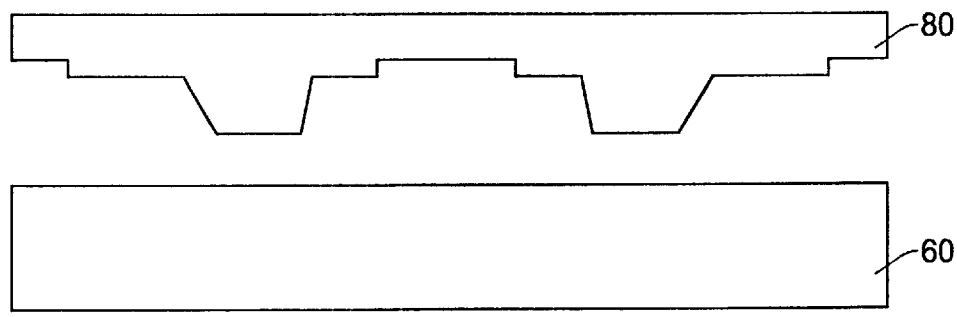
FIGS. 13A–13H are schematic diagrams showing a further example of production process using a plastic molding (hot embossing) technology for forming the contact structure in the first embodiment of the present invention.

FIGS. 13A–13H show another example of process for producing the contact structure of the present invention using a plastic molding (hot embossing) method. The molding process of FIGS. 13A–13H is especially advantageous to form a multilevel structure of the contactor through one molding process. In FIG. 13A, a plastic substrate 60 is prepared over which a mold insert 80 is provided to directly form a plating pattern on the plastic substrate 60. An example of material for the plastic substrate 60 is thermoplastic polymer or thermoplastic resin.

The mold insert 80 has a shape for copying the bridge like shape of the contactor of the present invention on the plastic substrate 60. The mold insert 80 is made, for example, of steel, copper or nickel. The shape of the mold insert 80 is realized by various methods including electron beam writing, deep UV photoresist, excimer laser ablation, electrodischarge machining, laser cutting, and X-ray lithography. In the example of FIG. 13A, the mold insert 80 has an insert portion at the bottom thereof which has a shape corresponding to the bridge like contactors 30 of the present invention.

Figure 13B:
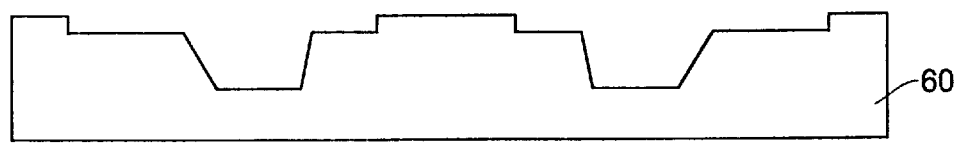
Figure 13C:
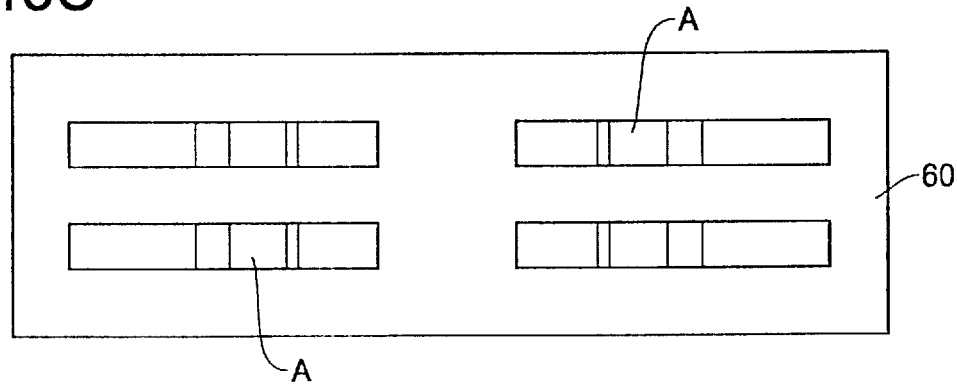

Then, the mold insert 80 is fully pressed against the plastic substrate 60 under the high temperature atmosphere. When the mold insert 80 is removed under the lower temperature, a hollow, i.e., a plating pattern A shown in FIG. 13B is created on the plastic substrate 60. Such a plating pattern depicts the structure of the bridge shaped contactors 30 including the vertical portions and the horizontal portion. FIG. 13C is a top view of the plastic substrate 60 showing the plating pattern A created on the substrate 60 by the mold insert 80. A thin metal layer (not shown) made of copper, for example, is provided on the plastic substrate 60 as a seed layer to achieve electrical conductivity for an electroplating process. If the contactors 30 are formed through other deposition process such as sputtering, the seed layer is unnecessary.

Figure 13D:
Figure 13E:
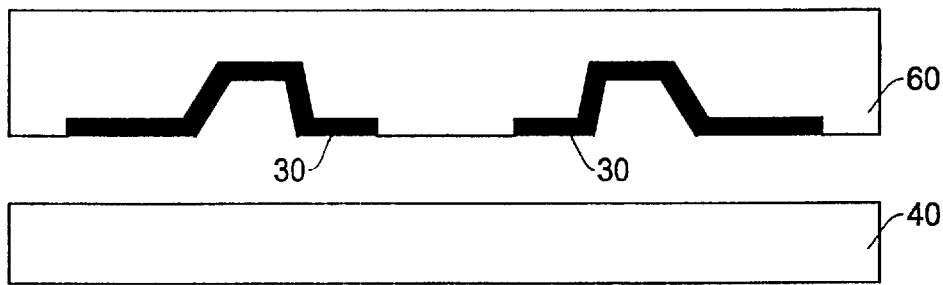
Figure 13F:
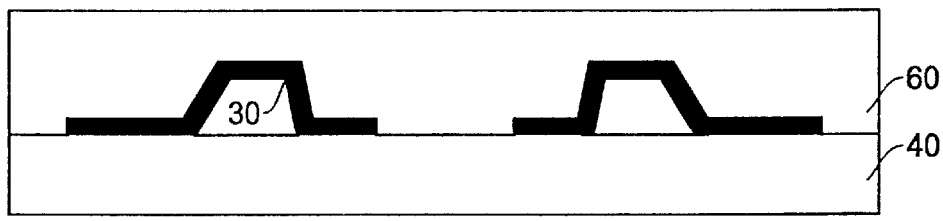

In FIG. 13D, an electroplating process is performed on the pattern formed by the plastic molding in the foregoing, thereby creating the contactor 30 on the plastic substrate 60. An example of the conductive material for the contactor 30 in the plating processes includes nickel, aluminum and copper. In the next process shown in FIGS. 13E and 13F, the plastic substrate 60 is accurately positioned over a substrate 40 and is bonded to an upper surface of the substrate 40. Typically, the substrate 40 is a silicon or ceramic substrate.

Figure 13G:
Figure 13H:
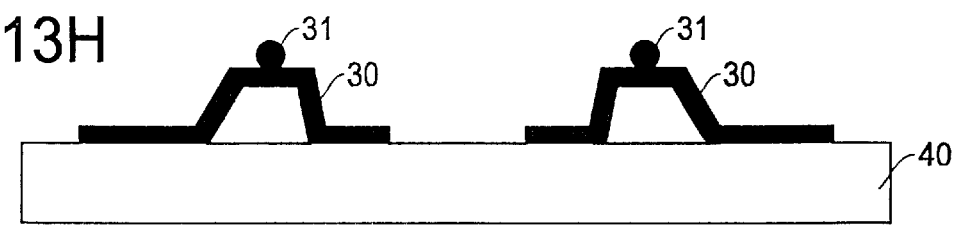

In FIG. 13G, the plastic substrate 60 is stripped off with use of a special solvent, leaving the contactors 30 on the substrate 40. The contact bumps 31 such as spherical contacts are attached to the top of the contactors 30 by soldering, brazing, welding, or applying a conductive adhesive. Alternatively, the contact bumps 31 may be created through a photolithography process by depositing the photoresist on the contactors 30, defining the contact bumps on the photoresist, and electroplating the conductive material on the contactors 30. As in the foregoing, the contactors 30 and contact bumps 31 are formed on the substrate 40 by the plastic mold (hot embossing) process. Although only two contactors 30 are shown in the foregoing explanation, a large number of contactors 30 can be produced at the same time by the production process of the present invention.

Figure 14:
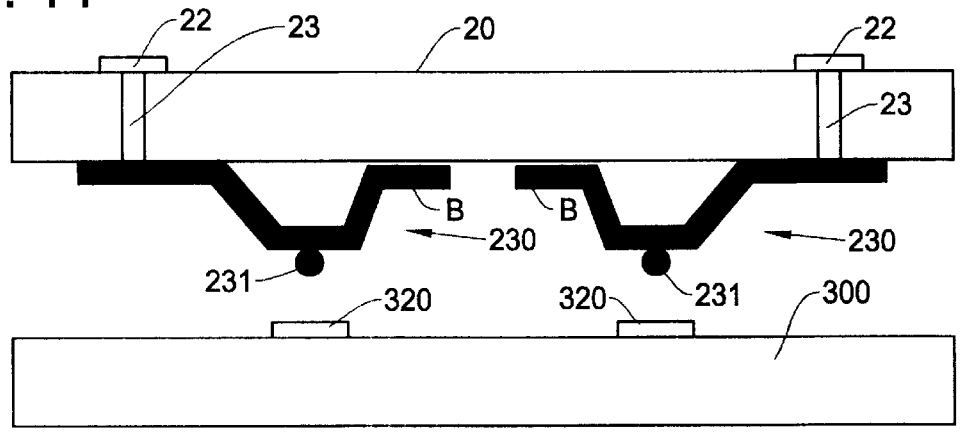
FIG. 14 is a schematic cross sectional diagram showing a further example of the contact structure in the first embodiment where one end of the bridge shape is slidably configured on the contact substrate.

FIG. 14 shows a further modification of the contact structure in the first embodiment of the present invention. The contact structure of FIG. 14 includes a plurality of contactors 230 formed on a contact substrate 20. The contact structure is positioned over a semiconductor wafer 300 having contact targets 320 such as contact pads or electrodes. The contactor 230 has a bridge like shape on which a contact bump 231 is provided as a contact point. Therefore, the contact structure of FIG. 14 is almost identical to that of FIG. 7 except that one base portion B of the contactor 230 is not attached to the contact substrate 20. The other base portion of the contactor 230 functions as an interconnect trace to be connected to a contact pad or electrode 22 on the upper surface of the contact substrate 20 through the via hole 23. Since the base portion B is slidable on the surface of the contact substrate 20, a horizontal movement of the contact bump 231 is promoted when the contact structure is pressed against the semiconductor wafer, thereby easily achieving the scrubbing effect on the surface of the contact target 320.

Figure 15:
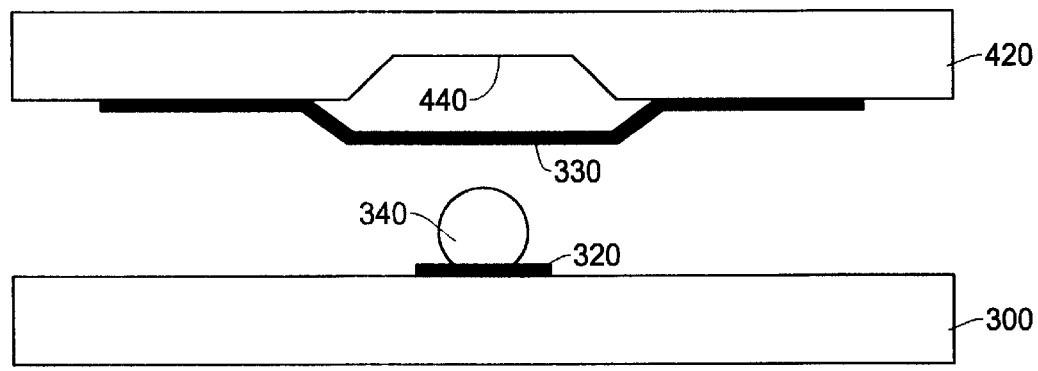
FIG. 15 is a schematic cross sectional diagram showing an example of the contact structure in the second embodiment of the present invention having a depression on the contact substrate.
Figure 16:
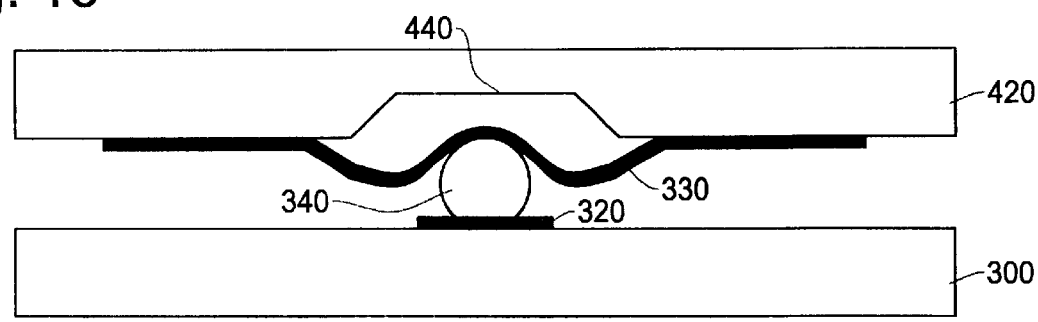
FIG. 16 is a schematic cross sectional diagram showing the contact structure of the present invention when the contact structure of FIG. 15 is pressed against the contact target formed of a solder ball.

FIGS. 15–19 show an example of contact structure in the second embodiment of the present invention having a depression on the contact substrate. The contact structure in the second embodiment is suitable for establishing an electrical communication with a contact target which is projected from the flat surface of the device to be tested. For example, such a contact target is a solder ball 340 provided on the surface of the semiconductor wafer 300 as shown in FIGS. 15 and 16. The contact structure is formed of a bridge shaped contactor 330 mounted on a contact substrate 420. The contact structure further includes a depression (recess) 440 over the contactor 330.

Since the contact target, the solder ball 340 for example, has a relatively large vertical size, the contactor 330 may be deformed upwardly in such a degree that the contactor 330 would touch the bottom surface of the contact substrate 420 when the contact structure is pressed against the wafer 300. The depression 440 is to attain enough space (recess) in such a situation so as to maintain the flexibility and reliability in the contact structure. Thus, as shown in FIG. 16, when the contact structure is pressed against the wafer 300, the contactor 330 will still be flexible because of the free space in the depression 440.

Figure 17:
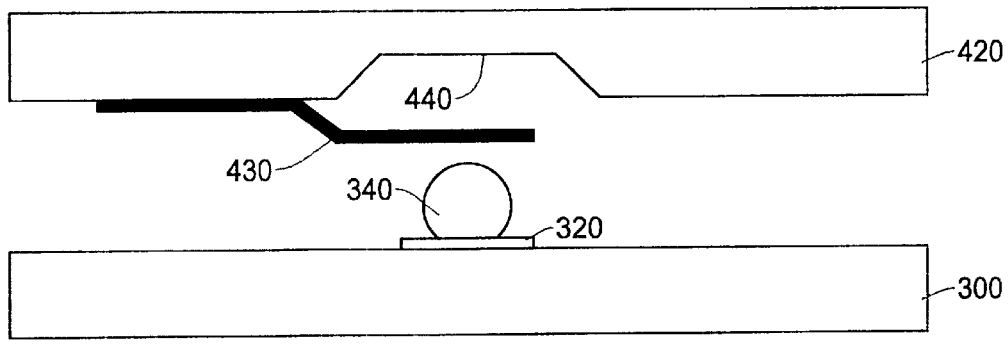
FIG. 17 is a schematic cross sectional view showing a modified version of the second embodiment of the contact structure having the depression on the contact substrate.

FIG. 17 shows another example of contact structure in the second embodiment of the present invention having the depression on the contact substrate. In this example, a contactor 430 has a base portion connected to the contact substrate 420 and a free horizontal portion. Thus, the shape of the contactor 430 is similar to the one half of the bridge shaped contactor 330 of FIG. 15. The contact substrate 420 is provided with the depression (recess) 440 to establish a sufficient space for accepting the contactor 430 and the contact target 340 when the contact structure is pressed against the semiconductor wafer 300.

Figure 18A:
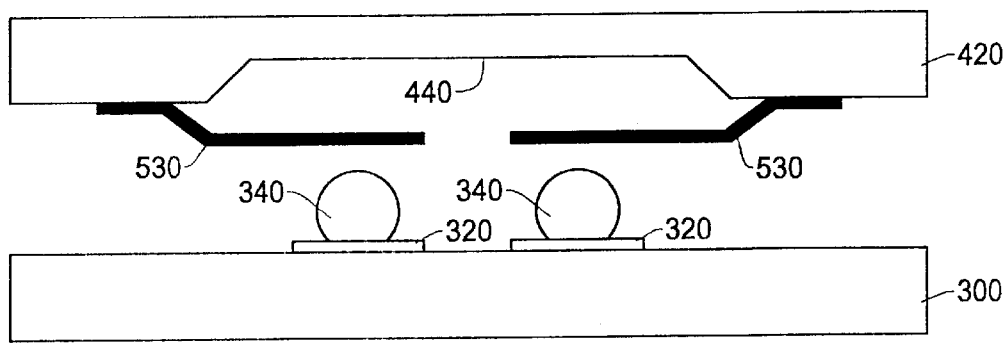
FIG. 18A is a schematic cross sectional view showing another modified version of the second embodiment of the contact structure having the depression on the contact substrate.
Figure 18B:
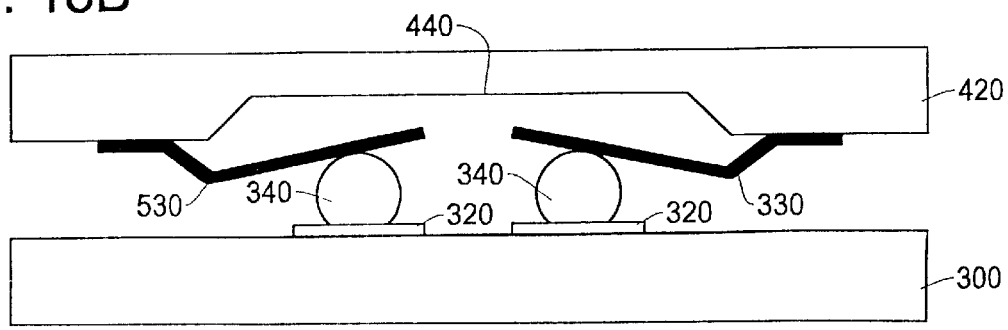
FIG. 18B shows the contact structure of the present invention when the contact structure of FIG. 18A is pressed against the contact target formed of a solder ball.

FIGS. 18A and 18B show a further example of contact structure in the second embodiment of the present invention having the depression on the contact substrate. In this example, two contactors 530 each having the structure similar to that of FIG. 16 are provided on the contact substrate 420 under the depression 440. FIG. 18A shows a situation before the contact structure is pressed against the semiconductor wafer 300 having contact targets 340 such as solder balls. FIG. 18B shows a situation during when the contact structure is pressed against the semiconductor wafer 300. The depression (recess) 440 on the contact substrate 420 provides a sufficient space for accepting the contactors 530 and the contact targets 340 therein.

Figure 19A:
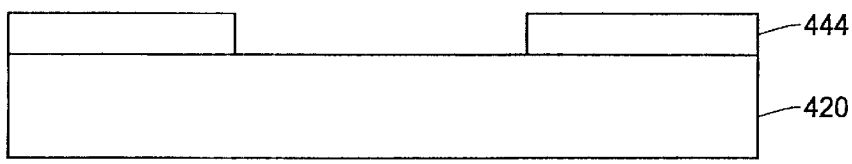
FIGS. 19A–19F are schematic diagrams showing an example of process for producing the contact structure in the second embodiment of FIG. 17.

FIGS. 19A–19F show an example of process for producing the contact structure in the second embodiment of FIG. 17. In FIG. 19A, a photoresist layer 444 is formed on the substrate 420 by a photolithography process. Such a photolithography process includes the steps of photoresist coating, masking, exposure, and photoresist stripping as is well known in the art. Although not shown, a photomask is aligned over the photoresist layer 444 so that the photoresist layer 444 is exposed with ultraviolet light based on the pattern printed on the photomask. If a positive acting photoresist is used, the photoresist covered by the opaque portions of the photomask harden (cure) after the exposure. The exposed part of the resist can be dissolved and washed away, leaving the photoresist layer 444 of FIG. 19A which defines an etching area.

Figure 19B:
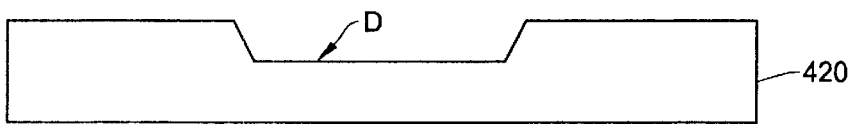
Figure 19C:
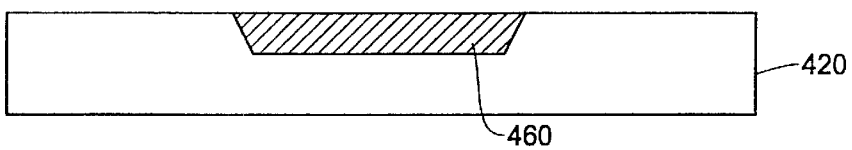

Through an etching process, an indented depression portion D is created on the substrate 420 as shown in FIG. 19B. The photoresist layer 444 in FIG. 19A is removed with use of a dissolution solvent. In FIG. 19C, a sacrificial part 460 is formed in the indented portion on the substrate 420. The sacrificial part 460 is made, for example, of silicon dioxide ($SiO_2$) through a deposition process such as chemical vapor deposition (CVD). A thin metal layer (not shown) such as made of copper is formed on the substrate to function as a plating seed layer.

Figure 19D:
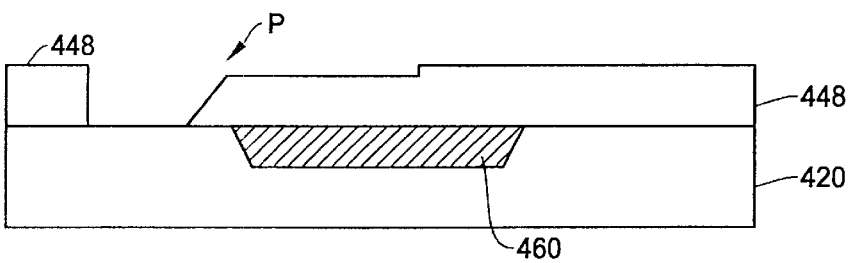

In FIG. 19D, a photoresist layer 448 is formed on the substrate 420 and a plating pattern P defining the shape of the contactors is created through a photolithography process including the masking, exposure and stripping steps. A gray-tone photomask such as shown in FIG. 9B may be preferably used to form the plating pattern P having different depths. Alternatively, the layer 448 can be an abrasive layer over which a micromachining tool (not shown) is provided to directly form the plating pattern P on the abrasive layer 448. An example of material for the abrasive layer 448 is epoxy or polyimide although many other materials are also feasible. Such a micromachining tool includes an electron beam machining tool, a laser beam machining tool, a plasma beam machining tool or other tools. For example, a laser source for such a purpose includes an excimer laser, a carbon dioxide ($CO_2$) laser and an ND:YAG laser.

Figure 19E:
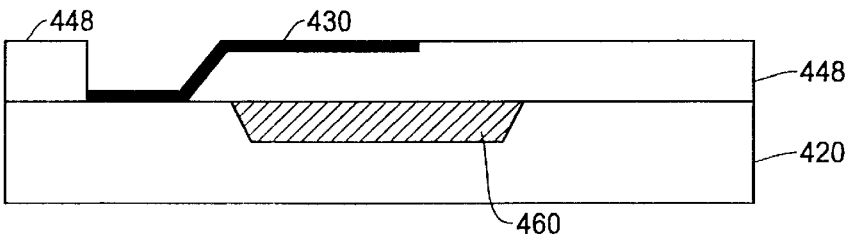
Figure 19F:
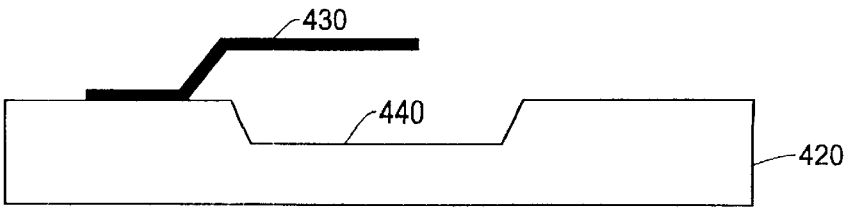

In FIG. 19E, the contactor 430 is created by plating an electroplating conductive material in the plating pattern P. An example of conductive material includes copper, nickel, aluminum or other metal. Although not shown, an overplating portion of the contactor 430 is cut out to form a planar surface as shown in FIG. 19E. In FIG. 19F, the photoresist layer (or abrasive layer) 448 and the sacrificial part 460 are stripped off with use of a special solvent, leaving the contactor 430 and the depression (recess) 440 on the substrate 420.

As in the foregoing, the contactor 430 of FIG. 19F having the horizontal portion, vertical (or angled) portion and base portion is formed on the silicon substrate 420 by the photolithography and micromachining technology. When the contact structure of FIG. 19F is used to establish electrical communication with contact target 340 such as solder ball in FIG. 17, the depression (recess) 440 allows the contactor 430 to enter therein to exert the contact force against the contact target 340.

Figure 1:
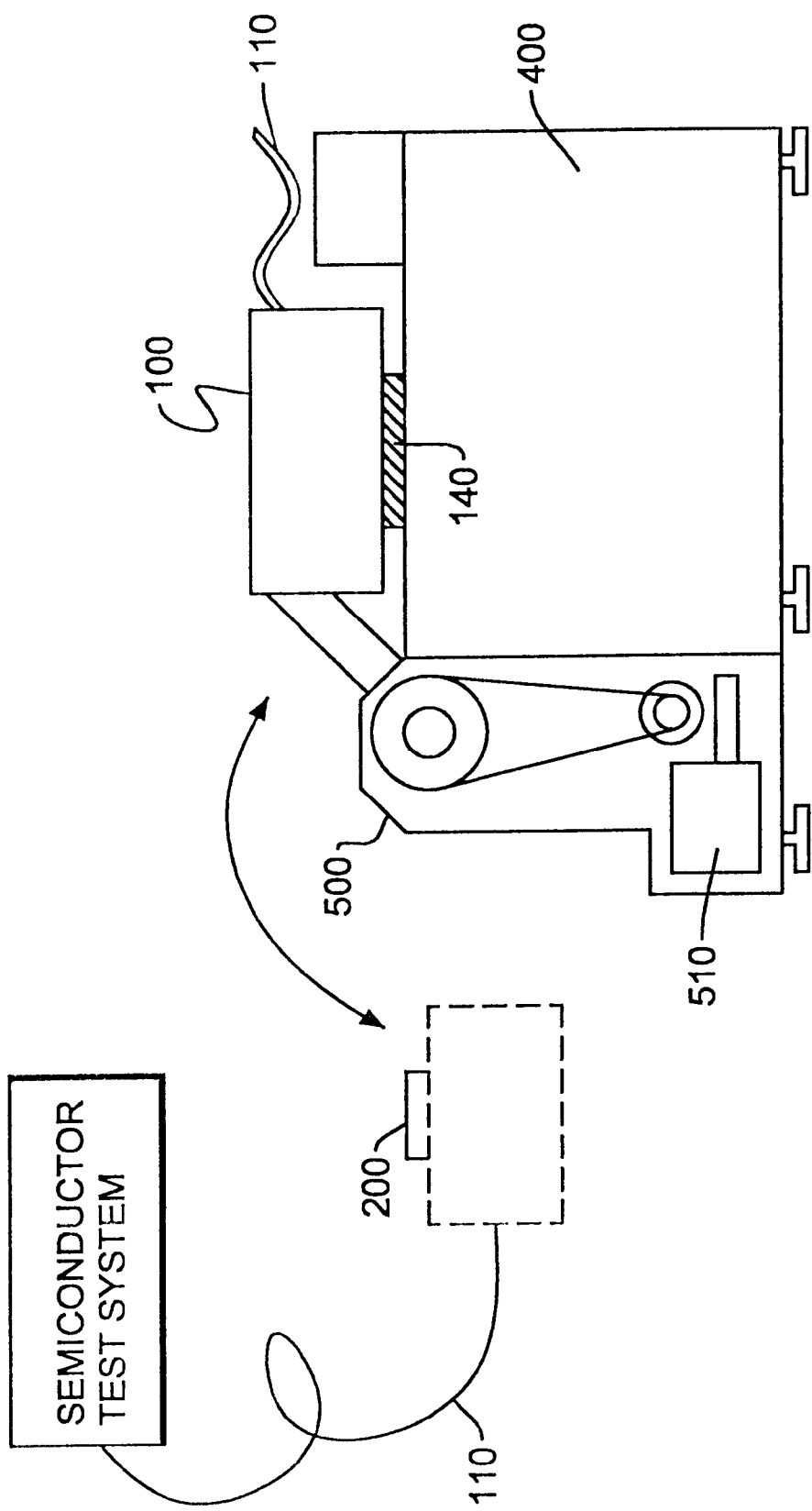
FIG. 1 is a schematic diagram showing a structural relationship between a substrate handler and a semiconductor test system having a test head.
Figure 2:
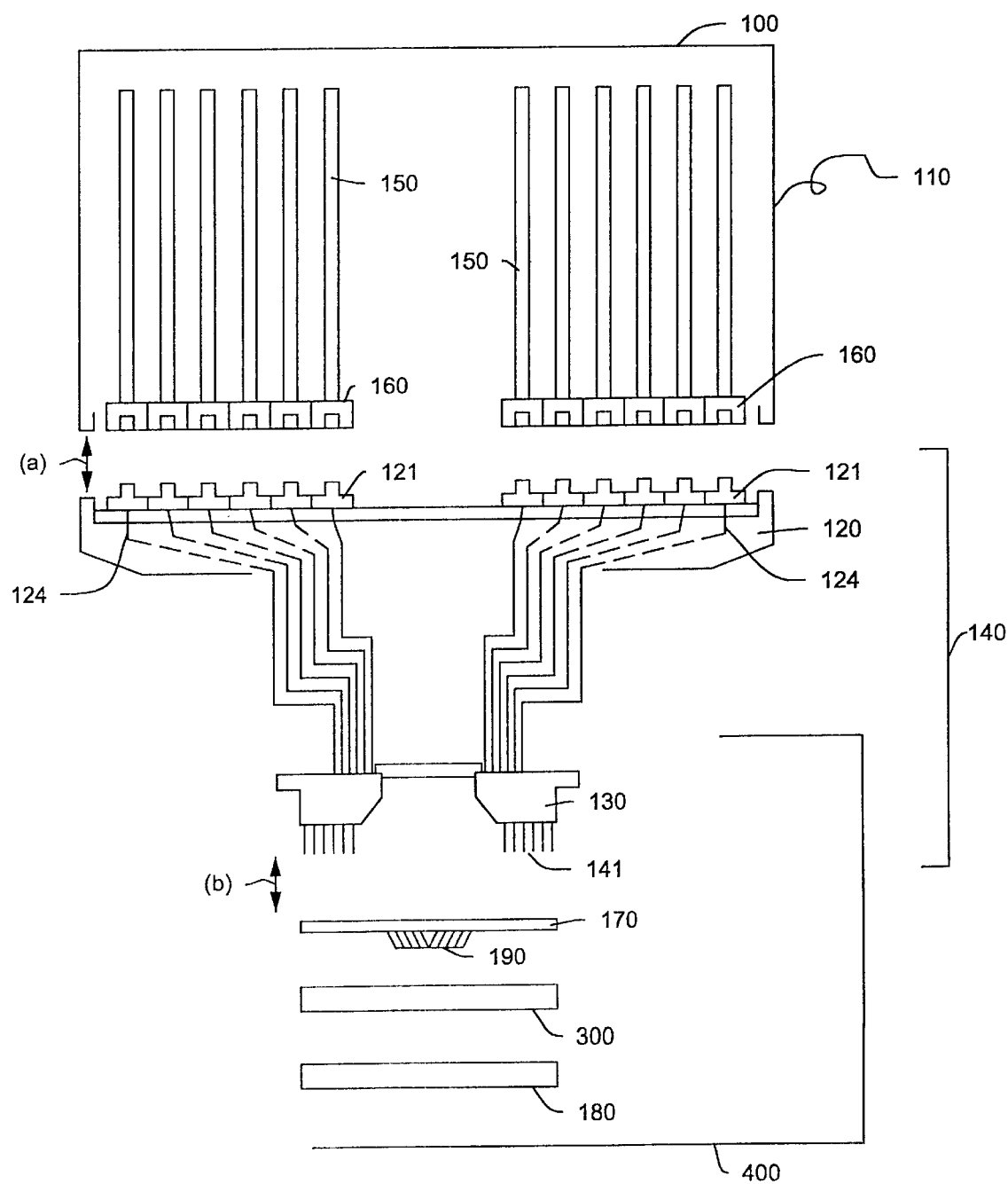
FIG. 2 is a diagram showing an example of a more detailed structure for connecting the test head of the semiconductor test system to the substrate handler through an interface component.
Figure 20:
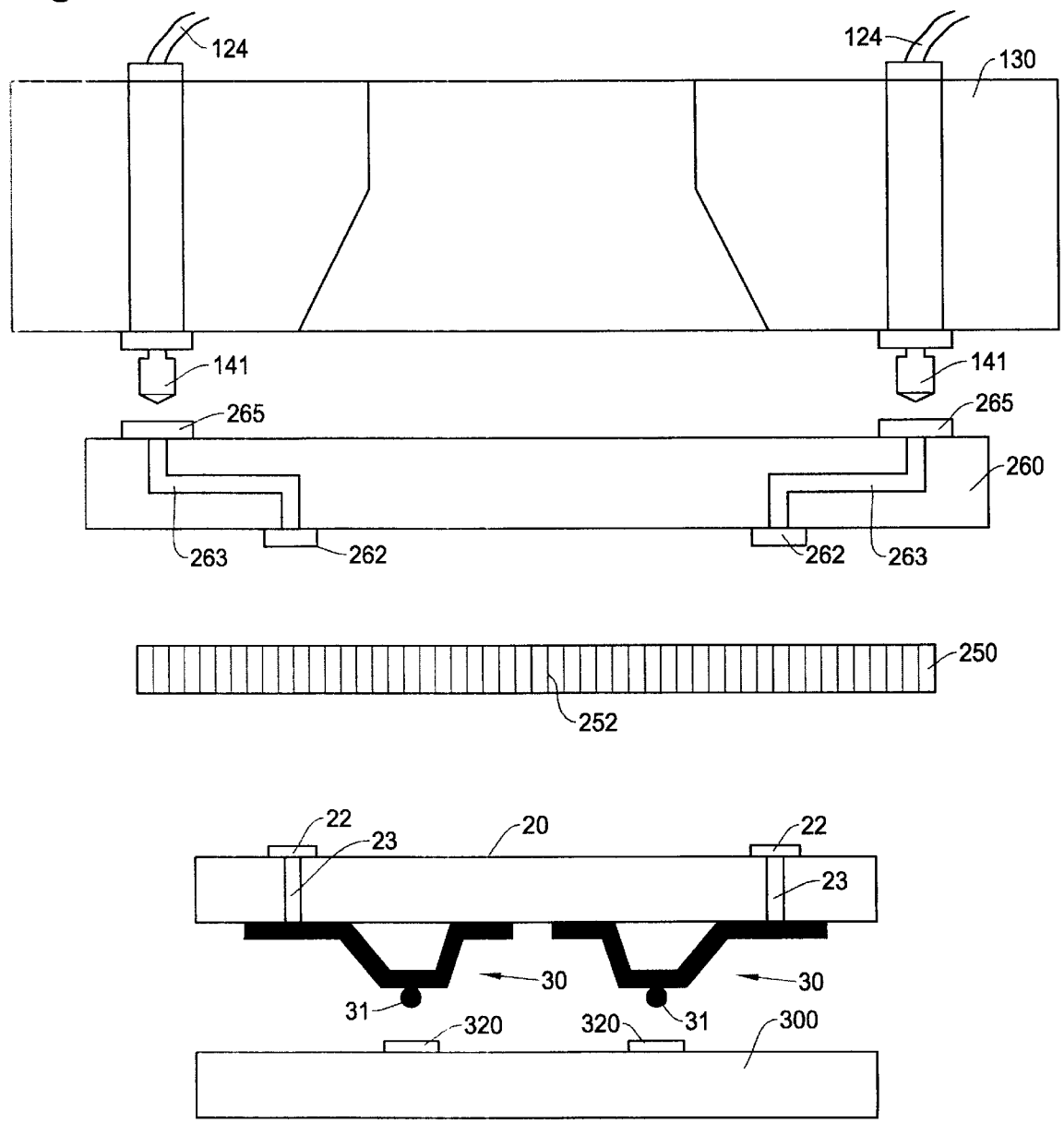
FIG. 20 is a cross sectional view showing an example of total stack-up structure incorporating the contact structure of the present invention between a semiconductor device under test and a semiconductor test system.

FIG. 20 is a cross sectional view showing an example of total stack-up structure using the contact structure of the present invention (embodiment of FIG. 7) as an interface between a device under test (DUT) and a test head such as shown in FIG. 2. In this example, the interface assembly includes a conductive elastomer 250, a routing board (probe card) 260, and a pogo-pin block (frog ring) 130 provided over the contact structure in the order shown in FIG. 20.

The conductive elastomer 250, routing board 260 and pogo-pin block 130 are mechanically as well as electronically connected with one another. Thus, electrical paths are created from the contact bump 31 of the contactors 30 to the test head 100 through the cables 124 and performance board 120 (FIG. 2). Thus, when the semiconductor wafer 300 and the interface assembly are pressed with each other, electrical communication will be established between the DUT (contact pads 320 on the wafer 300) and the test system.

The pogo-pin block (frog ring) 130 is equivalent to the one shown in FIG. 2 having a large number of pogo-pins to interface between the probe card 260 and the performance board 120. At upper ends of the pogo-pins, cables 124 such as coaxial cables are connected to transmit signals to printed circuit boards (pin electronics cards) 150 in the test head 100 in FIG. 2 through the performance board 120. The routing board 260 has a large number of electrodes 262 and 265 on the upper and lower surfaces thereof. The electrodes 262 and 265 are connected through interconnect traces 263 to fan-out the pitch of the contact structure to meet the pitch of the pogo-pins in the pogo-pin block 130.

The conductive elastomer 250 is provided between the contact structure and the probe card 260. The conductive elastomer 250 is to ensure electrical communications between the contact pads 22 connected to the contactors 30 and the electrodes 262 of the probe card by compensating planarization or vertical gaps therebetween. The conductive elastomer 250 is an elastic sheet having a large number of conductive wires in a vertical direction. For example, the conductive elastomer 250 is comprised of a silicon rubber sheet and a multiple rows of metal filaments. The metal filaments (wires) are provided in the vertical direction of FIG. 20, i.e., orthogonal to the horizontal sheet of the conductive elastomer 250. An example of pitch between the metal filaments is 0.05 mm with thickness of the silicon rubber sheet is 0.2 mm. Such a conductive elastomer is produced by Shin-Etsu Polymer Co. Ltd and available in the market.

According to the present invention, the contact structure has a very high frequency bandwidth to meet the test requirements of next generation semiconductor technology. Since the contact structure is formed through a modern miniaturization technology used in the semiconductor production process, a large number of contactors can be aligned in a small space which is suitable for testing a large number of semiconductor devices at the same time. The contact structure of the present invention can also be used in more general applications including an IC lead, IC packaging, and other electrical connections.

Since the large number of contactors are produced at the same time on the substrate with the use of the microfabrication technology without involving manual handling, it is possible to achieve consistent quality, high reliability and long life in the contact performance. Further, because the contactors can be fabricated on the same substrate material as that of the device under test, it is possible to compensate the temperature expansion coefficient of the device under test, which is able to avoid positional errors.

Although only preferred embodiments are specifically illustrated and described herein, it will be appreciated that many modifications and variations of the present invention are possible in light of the above teachings and within the purview of the appended claims without departing the spirit and intended scope of the invention.

What is claimed is:

1. A contact structure for establishing an electrical connection with a contact target, comprising:

a contact substrate;

a plurality of contactors mounted on the contact substrate, each of the contactors having a bridge like shape formed with a horizontal portion and two angled portions for supporting the horizontal portion, and two base portions at respective ends of the angled portions attached to the contact substrate, at least one of the two base portions being electrically connected to a contact pad provided on the contact substrate;

a contact bump attached to the horizontal portion of each of the contactors;

wherein one of the angled portions is widened toward the bottom thereof and is connected to two base portions, and wherein the horizontal portion and the angled portions of the contactor produce a contact force when the contact structure is pressed against the contact target.

2. A contact structure as defined in claim 1, wherein the contactor has an asymmetrical shape in cross section wherein the two angled portions have different angle and length from each other to promote a movement of the contact bump in a direction perpendicular to a direction of pressure applied between the contact structure and the contact target.

3. A contact structure as defined in claim 1, wherein the contactor has a symmetrical shape in cross section wherein the two angled portions have the same length and angle with one another.

4. A contact structure as defined in claim 1, wherein both of the angled portions are widened toward the bottom thereof, each of which is connected to two base portions.

5. A contact structure as defined in claim 1, wherein said contactor is made of nickel, aluminum, copper, nickel palladium, rhodium, nickel gold, or iridium.

6. A contact structure as defined in claim 1, wherein said horizontal portion of each of the contactors is provided with two or more contact bumps made of hard metal.

7. A contact structure as defined in claim 1, wherein said contact bump has a spherical shape and is made of a glass ball coated with tungsten or other metal.

8. A contact structure as defined in claim 1, wherein said contact bump has a spherical, squarish, trapezoidal, pyramidal or conical shape.

9. A contact structure as defined in claim 1, wherein said contact bump is made of hard metal including nickel, beryllium, aluminum, copper, nickel-cobalt-iron alloy or iron nickel alloy.

10. A contact structure as defined in claim 1, wherein said contact bump is formed of base metal such as nickel, beryllium, aluminum, copper, nickel-cobalt-iron alloy or iron nickel alloy and plated with a highly conductive, non-oxidizing metal such as gold, silver, nickel palladium, rhodium, nickel gold, or iridium.

11. A contact structure as defined in claim 1, wherein said contact bump is attached to the contactor by soldering, brazing, welding, or applying a conductive adhesive.

12. A contact structure for establishing an electrical connection with a contact target, comprising:
   a contact substrate;
   a plurality of contactors mounted on the contact substrate, each of the contactor having a bridge like shape formed with a horizontal portion, two angled portions for supporting the horizontal portion and two base portions at respective ends of the angled portions, one of the two base portions being attached to the contact substrate and electrically connected to a contact pad provided on the contact substrate, and the other base portion being slidably provided on the surface of the contact substrate;
   a contact bump attached to the horizontal portion of each of the contactors;
   wherein the horizontal portion and the angled portions of the contactor produce a contact force and said other base portion slides on the surface of said contact base when the contactor is pressed against the contact target, whereby promoting scrubbing of a surface of said contact target by said contact bump.

13. A contact structure as defined in claim 1, wherein said contact bump has a spherical, squarish, trapezoidal, pyramidal or conical shape.

14. A contact structure as defined in claim 12, wherein said contact bump is made of hard metal including nickel, beryllium, aluminum, copper, nickel-cobalt-iron alloy or iron nickel alloy.

15. A contact structure as defined in claim 12, wherein said contact bump is formed of base metal such as nickel, beryllium, aluminum, copper, nickel-cobalt-iron alloy or iron nickel alloy and plated with a highly conductive, non-oxidizing metal such as gold, silver, nickel palladium, rhodium, nickel gold, or iridium.

16. A contact structure for establishing an electrical connection with a contact target, comprising:
   a dielectric substrate having a depression on a surface thereof; and
   a contactor having a bridge like shape formed on the substrate through a microfabrication process, the contactor being formed with a horizontal portion having two angled ends connected to the dielectric substrate where the horizontal portion is positioned over the depression on the dielectric substrate;
   wherein said contactor is formed of a horizontal portion having a free end and the other end thereof is connected to an angled portion, said angled portion having a base portion which is connected to the dielectric substrate in such a way that said free end of said horizontal portion is positioned over said depression on said dielectric substrate, and wherein the horizontal portion of the contactor produces a contact force when the contactor is pressed against the contact target such that the horizonal portion enters the depression while exerting the contact force.

17. A contact structure as defined in claim 16, wherein two contactors each having the horizontal portion with the free end are provided to the dielectric substrate in such a way that said free ends of said two horizontal portions are positioned over said depression on said dielectric substrate.

* * * * *